(12) United States Patent
Frey et al.

(10) Patent No.: US 11,442,206 B2
(45) Date of Patent: Sep. 13, 2022

(54) IMAGE SENSOR COMPRISING AN ARRAY OF INTERFERENCE FILTERS

(71) Applicant: Commissariat à l'Énergie Atomique et aux Énergies Alternatives, Paris (FR)

(72) Inventors: Laurent Frey, Grenoble (FR); Lilian Masarotto, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 498 days.

(21) Appl. No.: 16/434,104

(22) Filed: Jun. 6, 2019

(65) Prior Publication Data
US 2019/0377109 A1    Dec. 12, 2019

(30) Foreign Application Priority Data
Jun. 8, 2018 (FR) .................................... 1800585

(51) Int. Cl.
*F21V 9/04* (2018.01)
*F21V 9/06* (2018.01)
(Continued)

(52) U.S. Cl.
CPC ............... *G02B 5/08* (2013.01); *G02B 5/281* (2013.01); *G02B 5/283* (2013.01);
(Continued)

(58) Field of Classification Search
CPC ........ G02B 5/201; G02B 5/281; G02B 5/283; H01L 27/14621; H04N 5/332
See application file for complete search history.

(56) References Cited

U.S. PATENT DOCUMENTS

2015/0212245 A1* 7/2015 Ueda ...................... G02B 5/285
                                                                              359/588
2017/0034456 A1    2/2017 Kyung et al.

FOREIGN PATENT DOCUMENTS

WO    WO 2012/004934 A1    1/2012
WO    WO 2015/195123 A1    12/2015

OTHER PUBLICATIONS

FR1800585, date of mailing Apr. 5, 2019, Preliminary Search Report.

(Continued)

*Primary Examiner* — Darryl J Collins
*Assistant Examiner* — Tamara Y. Washington
(74) *Attorney, Agent, or Firm* — Wolf, Greenfield & Sacks, P.C.

(57) ABSTRACT

A pixelated filter intended to rest on a support and including, in a stacking direction: first filter pixels each including a first interference filter covered with a first dielectric block; and second filter pixels each including a second dielectric block, having a thickness greater than or equal to the thickness of the first interference filter, covered with a second interference filter, having a thickness smaller than or equal to the thickness of the first dielectric block, wherein, for at least one of the second filter pixels, the second dielectric block of the second filter pixel is interposed between the first interference filters of two first filter pixels and the second interference filter of the second filter pixel is interposed between the first dielectric blocks of the first two filter pixels.

12 Claims, 11 Drawing Sheets

(51) Int. Cl.
*G02B 5/08* (2006.01)
*G02B 5/20* (2006.01)
*G02B 5/28* (2006.01)
*H01L 27/146* (2006.01)
*H04N 5/33* (2006.01)

(52) U.S. Cl.
CPC ....... *H01L 27/14621* (2013.01); *H04N 5/332* (2013.01); *G02B 5/201* (2013.01)

(56) References Cited

OTHER PUBLICATIONS

Preliminary Search Report for French Application No. 1800585, dated Apr. 5, 2019.

* cited by examiner

IMAGE SENSOR COMPRISING AN ARRAY OF INTERFERENCE FILTERS

CROSS-REFERENCE TO RELATED APPLICATIONS

The present patent application claims the priority benefit of French application number 1800585, filed Jun. 8, 2018. The entire contents of which is incorporated herein by reference in its entirety.

BACKGROUND

The present disclosure concerns an interference filter, particularly for an image sensor, and a method of manufacturing such an interference filter.

DISCUSSION OF THE RELATED ART

It is known to form arrays of interference filters, particularly for image sensors, also called imagers, in the visible, infrared (particularly for wavelengths from 650 nm to 1,050 nm), and/or ultraviolet range, which require separating a plurality of frequency ranges. Such an array of filters is also called pixelated filter, a filter pixel, or elementary filter, corresponding to the smallest element of the filter having the same filtering properties.

An example of application of a pixelated filter corresponds to a device comprising a sensor capable of acquiring color images and infrared images. The pixelated filter may then comprise first filter pixels giving way to visible light and blocking infrared radiation and second filter pixels giving way to infrared radiation, particularly near infrared, and blocking visible light.

An interference filter is formed by a stacking of a plurality of layers. As an example, an interference filter may comprise a stack of semi-reflective metal layers separated by dielectric layers and/or an alternation of dielectric layers having different refraction indexes, also called optical indexes hereafter. The thicknesses of the filter layers depend on the desired filtering properties.

The forming of a pixelated filter requires forming dielectric layers having different thicknesses according to the considered filter pixel.

An example of a method of manufacturing a pixelated filter is described in document WO2015195123 and implements a lift-off method. A disadvantage of such a method is that it requires spacers, or transition areas, between neighboring filter pixels of approximately twice the total thickness of the filter. Such a method thus cannot be implemented with arrays of adjacent pixels of small size, typically from 3 µm to 5 µm. Indeed, the total thickness of multilayer filters is at least from 1 µm to 2 µm to obtain sufficiently selective spectral responses in color and infrared imaging applications.

A disadvantage is that if part of the light reaches the spacers, this causes a loss of signal by scattering and/or a distortion of the spectral responses of the filter pixels. Such losses may become significant when the spacer width is not negligible with respect to the lateral dimension, or size, of the filter pixel. This may in particular occur in the case of small filter pixels, having a lateral dimension smaller than 2 µm, even when the layers of the interference filter have a thickness of a few hundreds of nanometers. This may also occur for larger filter pixels, having a lateral dimension greater than 2 µm, with layers of the interference filter having a thickness of a few micrometers.

SUMMARY

An object of an embodiment is to overcome all or part of the disadvantages of the previously-described interference filters and manufacturing methods thereof.

Another object of an embodiment is for the lateral dimensions of the spacers of the interference filter to be decreased, or even for the interference filter to comprise no spacer between the filter pixels.

Another object of an embodiment is to form a pixelated interference filter with a filter pixel size smaller than 5 µm, preferably in the range from 3 µm to 4 µm, more preferably in the range from 1.5 µm to 3 µm.

Thus, an embodiment provides a pixelated filter intended to rest on a support and comprising, in a stacking direction:

first filter pixels each comprising a first interference filter covered with a first dielectric block; and second filter pixels, each comprising a second dielectric block having a thickness greater than or equal to the thickness of the first interference filter, covered with a second interference filter having a thickness smaller than or equal to the thickness of the first dielectric block, wherein, for at least one of the second filter pixels, the second dielectric block of the second filter pixel is interposed between the first interference filters of two first filter pixels and the second interference filter of the second filter pixel is interposed between the first dielectric blocks of the first two filter pixels, the pixelated filter comprising, between each pair of adjacent first and second filter pixels, a transition area having a minimum dimension between the first filter pixel and the second filter pixel of said pair, perpendicularly to the stacking direction, smaller than 500 nm, and wherein the pixelated filter comprises first and second opposite surfaces, the first surface being in contact with the support and the second surface being substantially planar.

According to an embodiment, each first interference filter comprises an alternation of first dielectric layers of a first dielectric material having a first refraction index in the visible range and of second dielectric layers of a second dielectric material having a second refraction index in the visible range smaller than the first refraction index and each second interference filter comprises an alternation of third dielectric layers of a third dielectric material having a third refraction index in the infrared range and of fourth dielectric layers of a fourth dielectric material having a fourth refraction index in the infrared range smaller than the third refraction index or each first interference filter comprises an alternation of the third dielectric layers and of the fourth dielectric layers, and wherein each second interference filter comprises an alternation of the first dielectric layers and of the second dielectric layers.

According to an embodiment, the first dielectric material may be selected from the group comprising silicon nitride (SiN), hafnium oxide ($HfO_x$), aluminum oxide ($AlO_x$), an alloy of aluminum, oxygen, and nitrogen ($AlO_xN_y$), an alloy of silicon, oxygen, carbon, and nitrogen ($SiO_xC_yN_z$), silicon nitride ($SiN_x$), niobium oxide ($NbO_x$), tantalum oxide ($TaO_x$), titanium oxide ($TiO_x$), and mixtures of at least two of these compounds.

According to an embodiment, the second dielectric material and/or the fourth dielectric material may each be selected from the group comprising silicon dioxide ($SiO_2$), magnesium fluoride ($MgF_2$), silicon oxide ($SiO_x$), silicon oxynitride ($SiO_xN_y$), hafnium oxide ($HfO_x$), aluminum oxide ($AlO_x$), a film made up of aluminum, oxygen, and nitrogen ($AlO_xN_y$), a film made up of silicon, oxygen, carbon, and nitrogen ($SiO_xC_yN_z$), silicon nitride ($SiN_x$), and mixtures of at least two of these compounds.

According to an embodiment, the third dielectric material may be selected from the group comprising amorphous silicon (aSi), hydrogenated amorphous silicon (aSiH), and mixture of these compounds.

An embodiment also provides an image sensor comprising a support and the pixelated filter such as previously defined resting on the support.

According to an embodiment, the sensor further comprises an antireflection layer between the support and the pixelated filter.

According to an embodiment, the sensor comprises, for each first filter pixel and covering said first filter pixel, at least one color filter capable of giving way to visible light only in a first wavelength range and a color filter capable of giving way to visible light only in a second wavelength range different from the first range.

According to an embodiment, the sensor comprises, for each color filter of each first filter pixel, a first lens covering said color filter, and comprises, for each second filter pixel, a second lens covering the second filter pixel.

An embodiment provides a method of manufacturing an interference filter such as previously defined, comprising the successive steps of:

a) depositing, on a substrate, a first stack of dielectric layers having the structure of the first interference filters;

b) etching the first stack to remove the first stack from the locations of the second filter pixels and keep the first interference filters at the locations of the first filter pixels;

c) depositing a first insulating layer, having a thickness greater than the thickness of the first stack, on the first interference filters and between the first interference filters;

d) etching at least a portion of the first insulating layer on the first interference filters;

e) depositing a second stack of dielectric layers having the structures of the second interference filters;

f) etching the second stack to remove the second stack from the locations of the first filter pixels and keep the second interference filters at the locations of the second filter pixels;

g) depositing a second insulating layer, having a thickness greater than the thickness of the second stack, on the second interference filters and between the second interference filters; and h) etching at least a portion of the second insulating layer on the second interference filters.

According to an embodiment, at step a), the first stack is deposited on a support comprising at least one raised area, the method comprising, at step b), etching the portion of the first stack covering the raised area.

According to an embodiment, the etching of the first insulating layer and/or of the second insulating layer comprises a chemical-mechanical polishing step.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
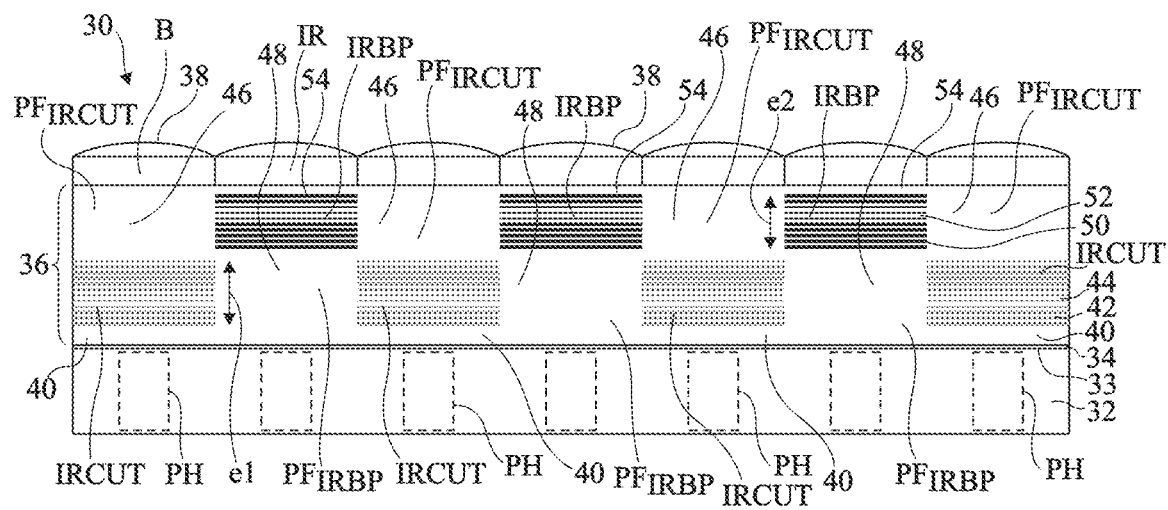
FIGS. 1 and 2 respectively are a cross-section view and a top view, partial and simplified, of an embodiment of an optoelectronic device comprising an interference filter.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for processing the signals supplied by the sensors described hereafter are within the abilities of those skilled in the art and are not described. The terms "approximately", "substantially", "about", and "in the order of" are used herein to designate a tolerance of plus or minus 10%, preferably of plus or minus 5%, of the value in question. Further, a "substantially planar" surface is a surface comprising no raised or recessed area having a thickness greater than 500 nm with respect to the average plane of the surface. Further, in the following description, the term "lateral size" or "dimension" of a sensor element designates the maximum dimension of this element in a plane perpendicular to the stacking direction of the layers forming the sensor.

In the following description, the refraction index of the material means the refraction index of the material over the operating wavelength range of the interference filter in the case where the refraction index of the material is substantially constant over the operating wavelength range of the interference filter, or means the average refraction index of the material over the operating wavelength range of the interference filter in the case where the refraction index of the material varies over the operating wavelength range of the interference filter Further, in the following description, "color filter" designates a homogeneous layer made of a single material, for example, an organic resin, having properties of spectral filtering by selective bulk absorption of light in the material. Further, the term "visible light" or "visible range" designates a radiation having wavelengths in the range from approximately 400 nm to approximately 700 nm.

In the following description, the term "transition area" or "spacer" between two adjacent filter pixels of the pixelated filter designates the region between the two filter pixels where the performance of the pixelated filter cannot be guaranteed due to manufacturing uncertainties, essentially the misalignment during lithography steps and the inclination of the sides resulting from an etch step. In particular, the transition area may comprise an area of overlapping of two interference filters, an area with no interference filter if the interference filters are relatively spaced apart, and/or the unusable edges of each interference filter, which may comprise surfaces which are not quite vertical.

Figure 2:
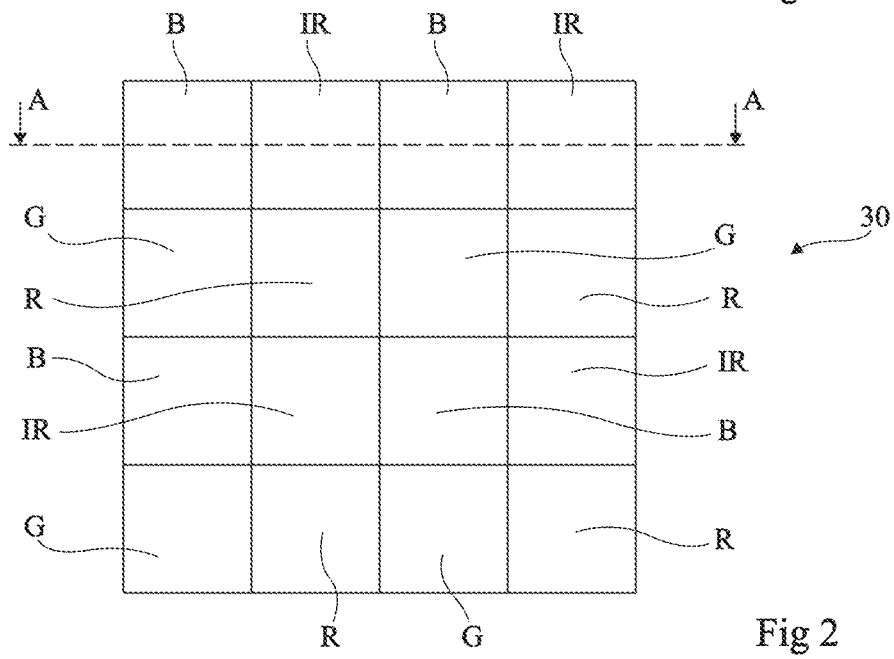

FIGS. 1 and 2 show an embodiment of an optoelectronic device 30 corresponding to an image sensor, FIG. 1 being a cross-section of FIG. 2 along line A-A. Optoelectronic device 30 comprises a support 32, for example, made of silicon, an antireflection monolayer or multilayer structure 34 covering upper surface 33 of support 32, and a pixelated interference filter 36 resting on antireflection layer 34.

Support 32 may comprise photon sensors or photodetectors PH, very schematically shown in FIG. 1 by squares in dotted lines. Optoelectronic device 30 may further comprise color filters, particularly red filters R, green filters G, blue filters B. and infrared filters IR, resting on pixelated interference filter 36. Optoelectronic device 30 may further comprise lenses 38, only shown in FIG. 1, covering color filters R, G, B, IR.

In the present embodiment, interference filter 36 comprises first and second filter pixels $PF_{IRBP}$ and $PF_{IRCUT}$.

In the present embodiment, each first filter pixel $PF_{IRCUT}$ comprises, from bottom to top in FIG. 1:

possibly a dielectric layer 40;

a first interference filter IRCUT having a thickness e and comprising an alternation of layers 42 of a first dielectric material having a high refraction index $n_{H1}$ and of layers 44 of a second dielectric material having a low refraction index $n_{B1}$, smaller than refraction index $n_{H1}$, where layers 42 may have different thicknesses and layers 44 may have different thicknesses; and a dielectric block 46, which may have a monolayer or multilayer structure.

In the present embodiment, each second filter pixel $PF_{IRBP}$ comprises, from bottom to top in FIG. 1:

a dielectric block 48 having a thickness greater than or equal to thickness $e_1$, where block 48 may have a monolayer or multilayer structure;

a second interference filter IRBP having a thickness $e_2$ smaller than or equal to the thickness of block 46 and comprising an alternation of layers 50 of a third dielectric material having a high refraction index $n_{H2}$ and of layers 52 of a fourth dielectric material having a low refraction index $n_{B2}$, smaller than refraction index $n_{H2}$, where layers 50 may have different thicknesses and layers 52 may have different thicknesses; and possibly a dielectric layer 54.

According to an embodiment, the second and fourth materials are identical. Dielectric layer 40 is made of a fifth dielectric material. Dielectric block 46 is made of at least one sixth dielectric material. Dielectric block 48 is made of at least one seventh dielectric material. Dielectric layer 54 is made of an eighth dielectric material. In the embodiment shown in FIG. 1, the fifth, sixth, seventh, and eighth dielectric materials are identical to the material of low refraction index of interference filters IRCUT and IRBP, that is, identical to the second and fourth materials. For this reason, in the drawings, the dielectric layers of low refraction index are not distinctly shown. As a variation, the fifth, sixth, seventh, and/or eighth dielectric materials may be different from the second and fourth materials. However, preferably, the fifth, sixth, seventh, and/or eighth dielectric materials are made of a material or of materials having refraction indexes close to the material of low refraction index of interference filters IRCUT and IRBP with a refraction index difference smaller than 0.1.

According to an embodiment, the first filter pixels $PF_{IRCUT}$ transmit visible light and substantially do not transmit the infrared radiation for wavelengths greater than a threshold in the range from 630 nm to 750 nm. According to an embodiment, the second filter pixels $PF_{IRBP}$ essentially transmit an infrared radiation in a single wavelength range having a width in the range from 10 nm to 100 nm.

The dielectric layers 42, 44, 50, 52 of filters IRCUT and IRBP are substantially planar. Preferably, filters IRCUT and IRBP comprise no spacers.

Photodetectors PH may be capable of detecting radiations in different wavelength ranges or of detecting radiations in the same wavelength range. In this last case, only the presence of filter pixels $PF_{IRCUT}$ and $PF_{IRBP}$ and of color filters R, G, B, and IR enables to detect radiations in different wavelength ranges. Each filter pixel can then cover at least one photodetector of the sensor and play the role of a bandpass filter for the incident radiation which reaches the sensor, to supply a radiation adapted to the range of wavelengths detected by the associated photodetector. The lateral dimensions of the filter pixels may be substantially equal to the lateral dimensions of the photosites of the image sensor or equal to a multiple of the lateral dimensions of the photosites of the image sensor. The layout of the filter pixels and of the color filters may follow that of the photosites of the image sensor. As an example, the filter pixels and the color filters may be arranged in a square, as shown in FIG. 2. Interference filter 36 may in particular be used with image sensors having photosites with a size smaller than 5 μm. The image sensor may be a color and infrared sensor.

According to an embodiment, each first filter pixel $PF_{IRCUT}$ is covered with at least two color filters among filters R, G, B giving way to visible light in different wavelength ranges. According to an embodiment, each second filter pixel $PF_{IRBP}$ is covered with a single color filter IR giving way to infrared radiation. According to an embodiment, optoelectronic device 30 comprises first color filters R covering the first filter pixels $PF_{IRCUT}$ and, for visible light, only giving way to red wavelengths, particularly, wavelengths in the range from 580 nm to 700 nm. According to an embodiment, optoelectronic device 30 comprises second color filters G covering the first filter pixels $PF_{IRCUT}$ and, for visible light, only giving way to green wavelengths, particularly, wavelengths in the range from 470 nm to 590 nm. According to an embodiment, optoelectronic device 30 comprises third color filters B covering the first filter pixels $PF_{IRCUT}$ and, for visible light, only giving way to blue wavelengths, particularly, wavelengths in the range from 380 nm to 500 nm. According to an embodiment, optoelectronic device 30 comprises fourth color filters IR covering the first filter pixels $PF_{IRBP}$ and which do not give way to visible light, and which particularly give way to a radiation of wavelengths in the range in the range from 750 nm to 3,000 nm.

Thicknesses $e_1$ and $e_2$ may be in the range from 0.5 μm to 4 μm, preferably from 1 μm to 3 μm.

According to an embodiment, the first dielectric material is transparent, that is, with an extinction coefficient smaller than $5 \cdot 10^{-3}$, in the visible range and in near infrared. According to an embodiment, the second dielectric material is transparent, that is, with an extinction coefficient smaller than $5 \cdot 10^{-3}$, in the visible range and in near infrared. According to an embodiment, the third dielectric material is transparent, that is, with an extinction coefficient smaller than $5 \cdot 10^{-3}$, in the visible range and in near infrared.

Refraction index $n_{H1}$ may be in the range from 1.8 to 2.5. Refraction index $n_{B1}$ or $n_{B2}$ may be in the range from 1.3 to 2.5. Refraction index $n_{H2}$ may be in the range from 1.8 to 4.5.

The first dielectric material may be selected from the group comprising silicon nitride (SiN), hafnium oxide (HfO$_x$), aluminum oxide (AlO$_x$), an alloy of aluminum, oxygen, and nitrogen (AlO$_x$N$_y$), an alloy of silicon, oxygen, carbon, and nitrogen (SiO$_x$C$_y$N$_z$), silicon nitride (SiN$_x$), niobium oxide (NbO$_x$), tantalum oxide (TaO$_x$), titanium oxide (TiO$_x$), and mixtures of at least two of these compounds.

The second dielectric material and the fourth dielectric material may each be selected from the group comprising silicon dioxide (SiO$_2$), magnesium fluoride (MgF$_2$), silicon oxide (SiO$_x$), silicon oxynitride (SiO$_x$N$_y$), hafnium oxide (HfO$_x$), aluminum oxide (AlO$_x$), a film made up of aluminum, oxygen, and nitrogen (AlO$_x$N$_y$), a film made up of silicon, oxygen, carbon, and nitrogen (SiO$_x$C$_y$N$_z$), silicon nitride (SiN$_x$), and mixtures of at least two of these compounds.

The third dielectric material may be selected from the group comprising amorphous silicon (aSi), hydrogenated amorphous silicon (aSiH), and mixture of these compounds.

Advantageously, the pixelated filter comprises, between each pair of first and second adjacent filter pixels, a transition area having a minimum dimension between the first filter pixel PF$_{IRCUT}$ and the second filter pixel PF$_{IRBP}$ of said pair, perpendicularly to the stacking direction, smaller than 500 nm.

Figure 3:
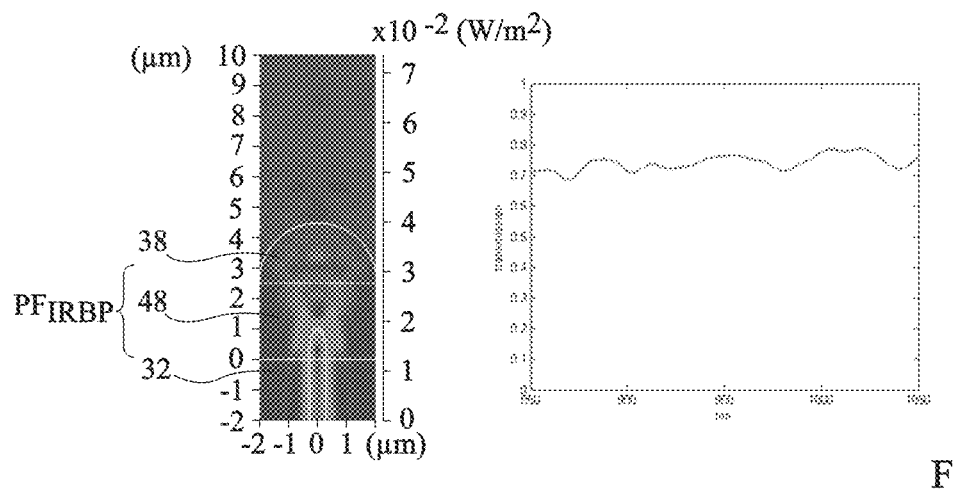
FIGS. 3 to 6 each show, in their left-hand portion, a map of the modulus of the Poynting vector in a cross-section view of an optoelectronic device comprising a filter pixel and, in their right-hand portion, a curve of the variation of the transmission of the filter pixel according to the wavelength for different structures of filter pixels and of microlenses.

FIG. 3 shows, in its left-hand portion, a heat map in grey levels of the modulus of the Poynting vector, which shows the electromagnetic energy flow in a cross-section view of a portion of optoelectronic device 30 in the case where filter pixel PF$_{IRBP}$ only comprises dielectric block 48 between silicon support 32 and lens 38. FIG. 3 shows, in its right-hand portion, a curve of the variation of the transmission of the radiation by the structure comprising the filter pixel and the lens according to the wavelength. For a photosite having, in top view, a square shape with a 4-μm side length and having an active area of collection of the incident radiation having a square shape with a 2-μm side length, an efficient collection of the incident radiation in the active area is obtained when the thickness of dielectric block 48 is in the order of 2.5 μm and the radius of curvature of lens 38 is equal to 2 μm. Lens 38 appears to focus the light approximately at the level of the surface of silicon support 32. The transmission varies little according to the wavelength and is in the order of 75%.

Figure 4:
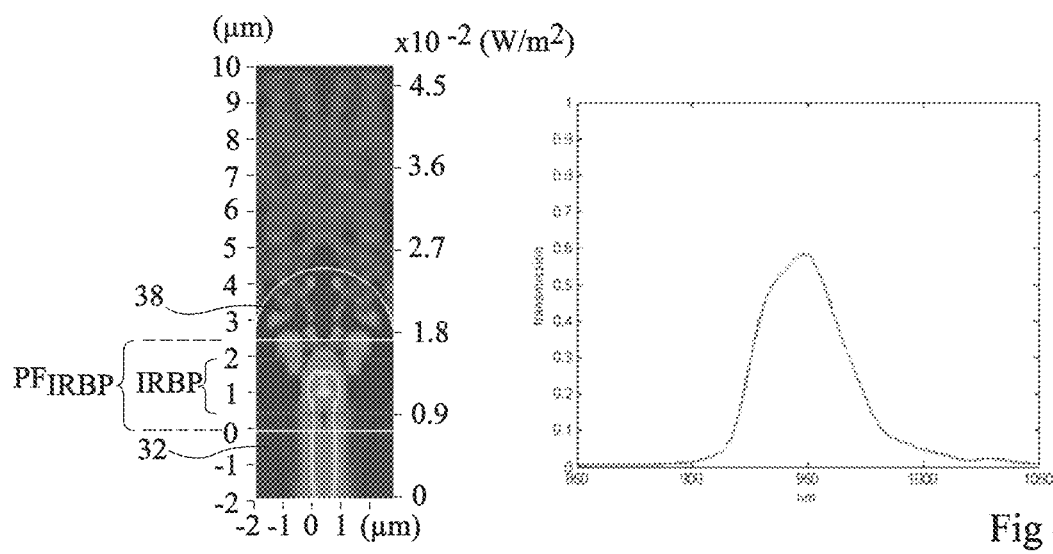

FIG. 4 is a drawing similar to FIG. 3 in the case where interference filter IRBP of filter pixel PF$_{IRBP}$ is arranged halfway between support 32 and lens 38, the interval between support 32 and lens 38 being equal to 2.5 μm and the radius of curvature of lens 38 being equal to 2 μm. A filtering of wavelengths can indeed be observed with, however, a decrease in the maximum transmission with respect to the case shown in FIG. 3. Further, the obtained spectral selectivity is relatively poor with, for example, a non-negligible transmission around 1,000 nm.

Figure 5:
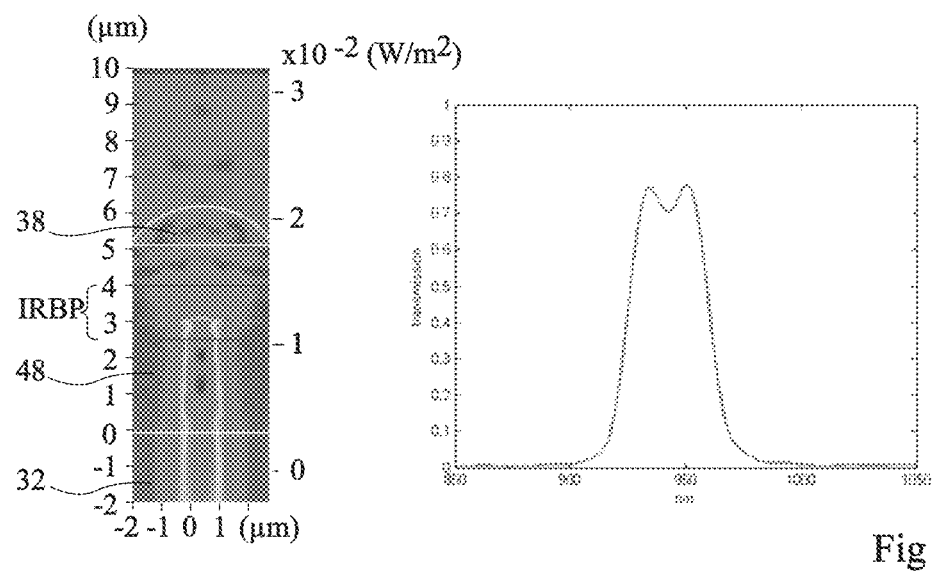

FIG. 5 is a drawing similar to FIG. 4 in the case where interference filter IRBP of filter pixel PF$_{IRBP}$ is provided between support 32 and lens 38, the interval between support 32 and lens 38 being equal to 5 μm and the radius of curvature of lens 38 being equal to 2.5 μm. An increase in the maximum transmission of the structure at the wavelengths of interest with respect to FIG. 4 appears when interference filter IRBP is present but the distance between support 32 and lens 38 is 2.5 μm. The maximum transmission is close to the case where there is no interference filter IRBP and where the distance between support 32 and lens 38 is 2.5 μm. The effect is obtained independently from the distance between interference filter IRBP and support 32.

Figure 6:
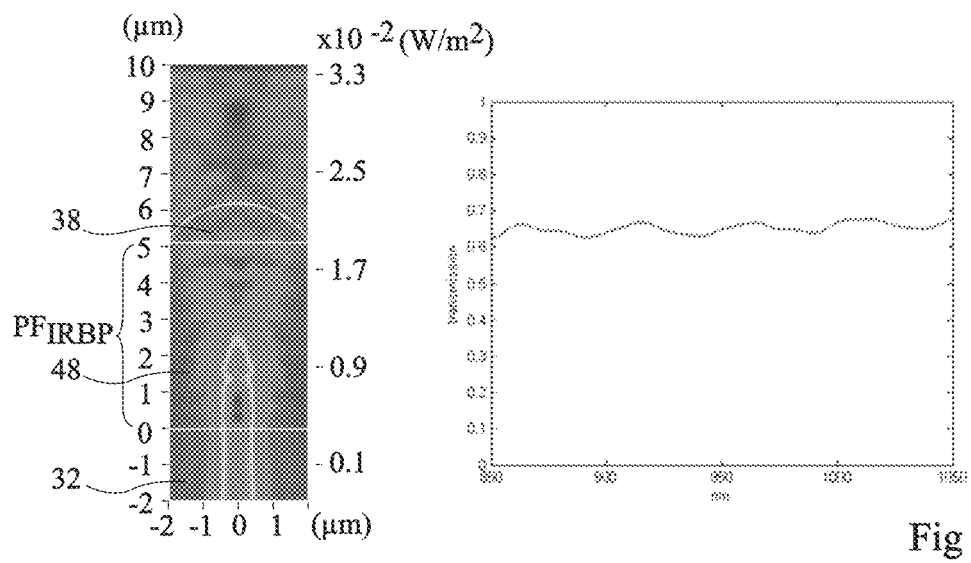

FIG. 6 is a drawing similar to FIG. 4 when filter pixel PF$_{IRBP}$ only comprises dielectric block 48 between support 32 and lens 38, the distance between support 32 and lens 38 being equal to 5 μm and the radius of curvature of lens 38 being equal to 2.5 μm. The transmission varies little according to the wavelength and is in the order of 65%, that is, smaller than the case illustrated in FIG. 3. As compared with FIG. 5, there surprisingly appears that the transmission at the wavelengths of interest when interference filter IRBP is present is more significant than when filter IRBP is absent.

Figure 7:
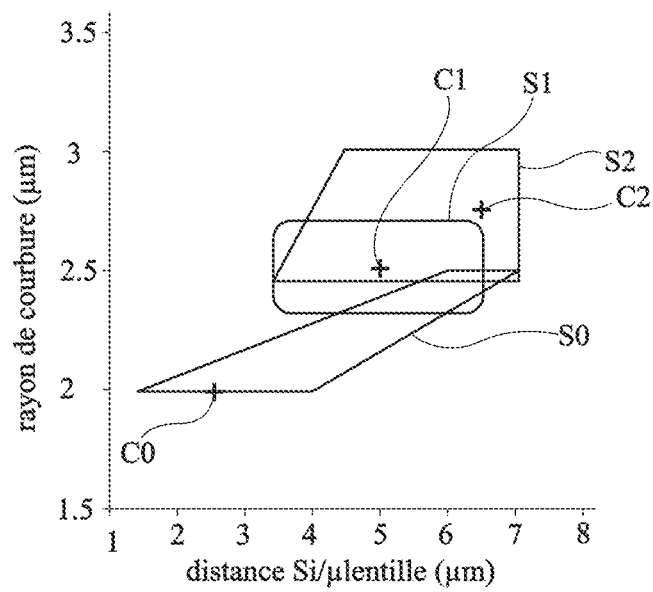
FIG. 7 shows domains corresponding to acceptable filter pixel structures according to the radius of curvature of the lens covering the filter pixel and to the distance between the support having the filter pixel and the lens resting thereon.

FIG. 7 shows the optimal operating points (cross C0, C1, and C2) and the optimal ranges of values for the radius of curvature and the distance from support 32 to lens 38, for a filter pixel comprising no interference filter (surface S0), in the case of a filter pixel PF$_{IRBP}$ (surface S1) and in the case of a filter pixel PF$_{IRCUT}$ (surface S2). FIG. 7 has been obtained for a photosite having, in top view, a square shape with a 4-μm side length with a filling factor, which corresponds to the ratio of the surface area of the active region of the photosite to the surface area of the photosite, of 25% for a photosite associated with second filter pixel PF$_{IRBP}$ and of 55% for a photosite associated with first filter pixel PF$_{IRCUT}$.

There clearly appears that the ranges of proper operation are substantially different between the configurations with and without an interference filter.

In the embodiment shown in FIGS. 1 and 2, a dielectric layer having a material with a low refraction index is present, according to the stacking direction, between the top of interference filter IRCUT of filter pixel PF$_{IRCUT}$ and the base of interference filter IRBP of filter pixel PF$_{IRBP}$.

Figure 8:
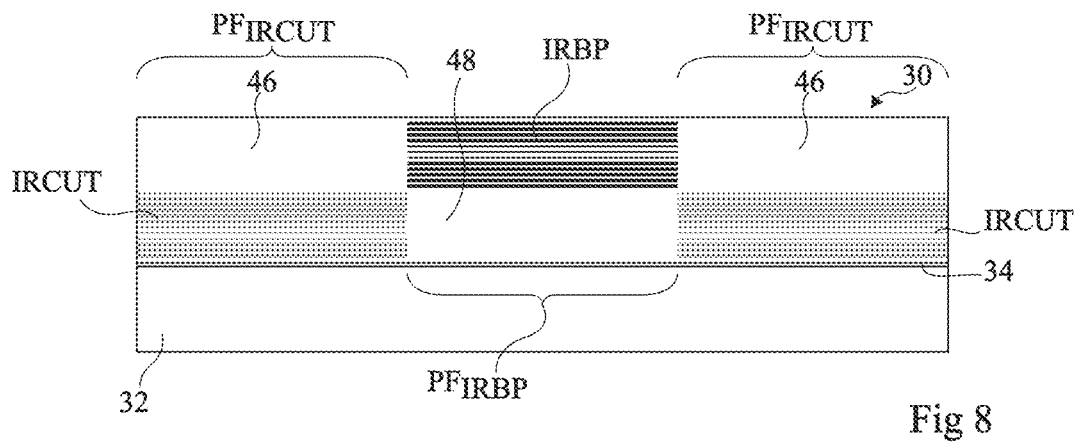
FIGS. 8 and 9 are partial simplified cross-section views of other embodiments of an interference filter.

FIG. 8 partially shows a variation of optoelectronic device 30 where, according to the stacking direction, the top of interference filter IRCUT of filter pixel PF$_{IRCUT}$ is flush with the base of interference filter IRBP of filter pixel PF$_{IRBP}$.

Figure 9:
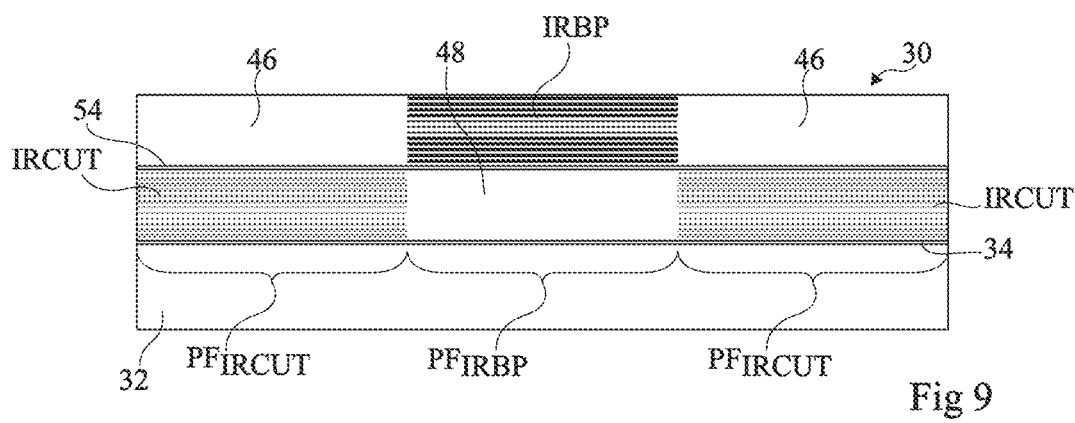

FIG. 9 shows another variation of optoelectronic device 30 where, according to the stacking direction, a dielectric layer 54, made of a ninth material, different from the first, second, third, and fourth materials, is present between the top of interference filter IRCUT of filter pixel PF$_{IRCUT}$ and the base of interference filter IRBP of filter pixel PF$_{IRBP}$. As will be described in further detail hereafter, layer 54 may be used as an etch stop layer on forming of interference filter IRBP.

FIGS. 10A to 10H are partial simplified cross-section views of structures obtained at successive steps of an embodiment of a method of manufacturing the optoelectronic device 30 shown in FIGS. 1 and 2. In the drawings, layers 34 and 40 are not shown.

Figure 10A:
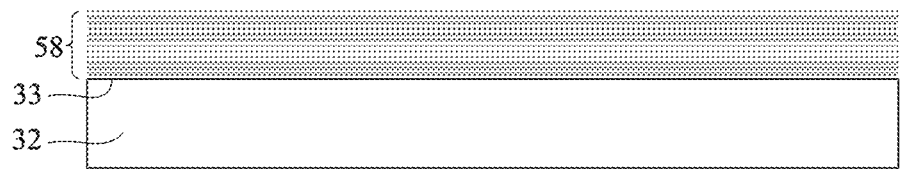
FIGS. 10A to 10H are partial simplified cross-section views of the structures obtained at successive steps of another embodiment of a method of manufacturing the optoelectronic device shown in FIGS. 1 and 2.

FIG. 10A shows the structure obtained after the deposition of a first stack 58 of dielectric layers having the desired structure of interference filters IRCUT over the entire upper surface 33 of support 32, where layers 34 and 40 are not shown.

Figure 10B:
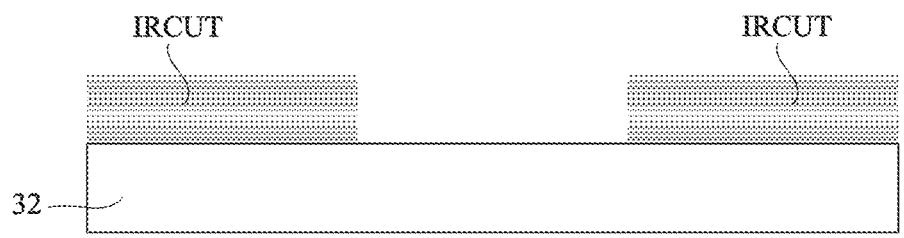

FIG. 10B shows the structure obtained after the etching of first stack 58 at the level of the desired locations of the second filter pixels to only keep filters IRCUT at the locations of first filter pixels $PF_{IRCUT}$.

Figure 10C:
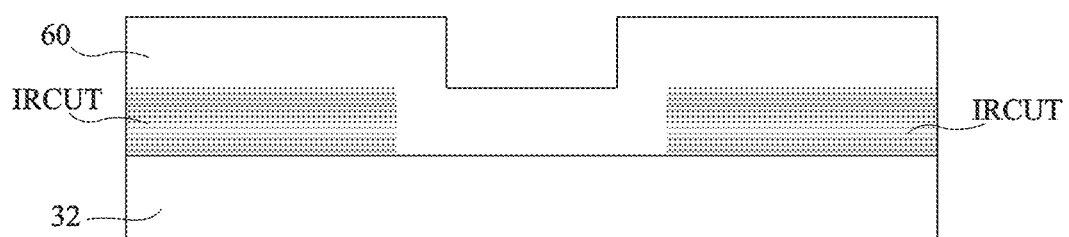

FIG. 10C shows the structure obtained after the deposition of a dielectric layer 60, made of the material forming blocks 48, on the first interference filters IRCUT and on support 32 between first interference filters IRCUT. The thickness of dielectric layer 60 is greater than or equal to the thickness of the first interference filters IRCUT.

Figure 10D:
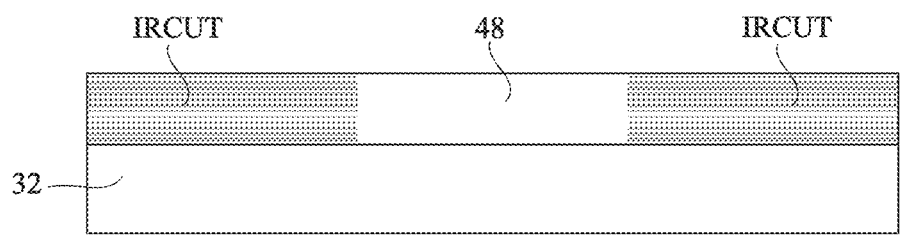

FIG. 10D shows the structure obtained after a step of planarization, for example, a chemical-mechanical polishing (CMP), which results in the removal of dielectric layer 60 from first interference filters IRCUT to only keep blocks 48 of the second filter pixels $PF_{IRBP}$. In the present embodiment, the last layer at the top of interference filters IRCUT may play the role of a stop layer for the planarization step.

Figure 10E:
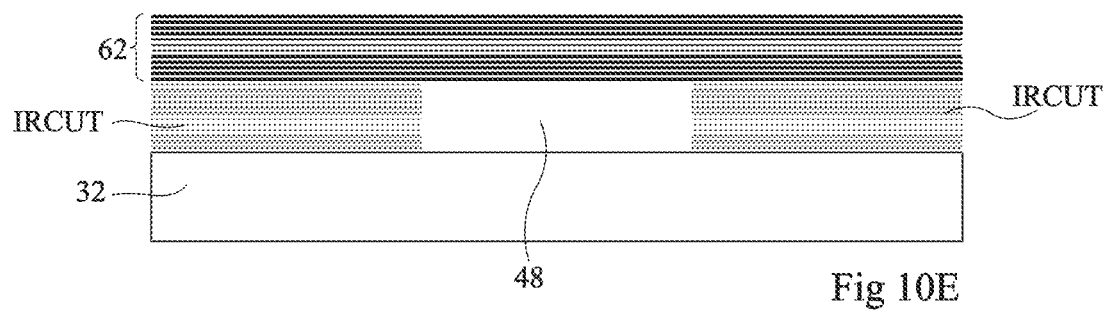

FIG. 10E shows the structure obtained after the deposition, all over the structure obtained at the previous step, of a second stack 62 of dielectric layers having the desired structure of interference filters IRBP. In particular, the second stack 62 covers interference filters IRCUT and blocks 48.

Figure 10F:
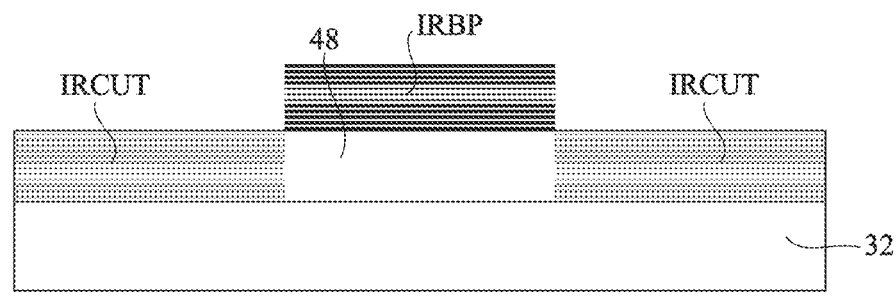

FIG. 10F shows the structure obtained after a step of etching the portions of stack 62 covering interference filters IRCUT to only keep the interference filters IRBP resting on blocks 48.

Figure 10G:
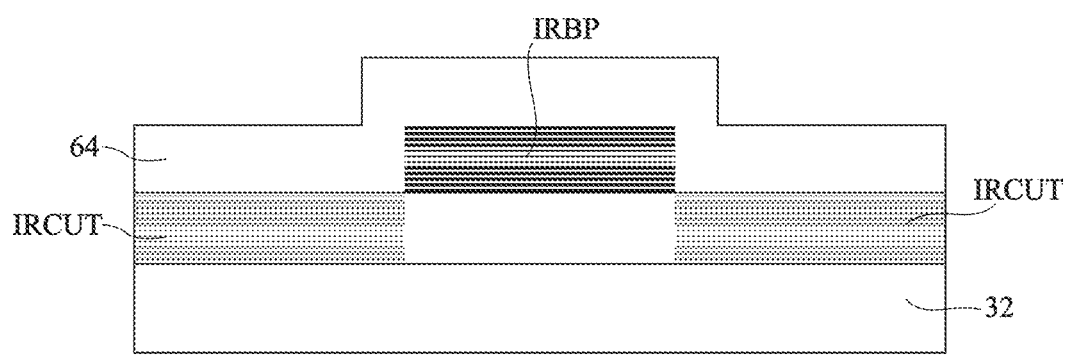

FIG. 10G shows the structure obtained after the deposition of a dielectric layer 64, made of the material forming blocks 46, all over the structure obtained at the previous step, particularly on interference filters IRCUT and on interference filters IRBP. The thickness of dielectric layer 64 is greater than or equal to the thickness of second interference filters IRBP.

Figure 10H:
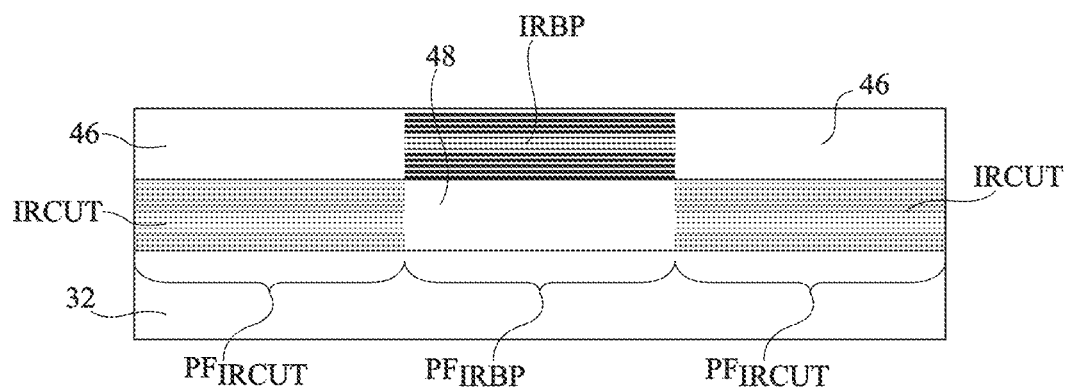

FIG. 10H shows the structure obtained after a planarization step, for example, a CMP, which causes the removal of dielectric layer 64 from interference filters IRBP to only keep blocks 46 of first filter pixels $PF_{IRCUT}$. In the present embodiment, the last layer at the top of interference filters IRBP may play the role of a stop layer for the planarization step.

The embodiment of the previously-described manufacturing method is particularly adapted to the case where upper surface 33 of support 32 is substantially planar. However, upper surface 33 of support 32 may comprise raised areas. This particularly occurs when support 32 corresponds to the back side of an electronic circuit manufactured according to a CMOS technology. The raised areas may in particular correspond to the contour of contact pads and have a transverse dimension in the order of a few micrometers.

FIGS. 11A to 11D are partial simplified cross-section views of structures obtained at successive steps of a method of manufacturing the optoelectronic device 30 shown in FIGS. 1 and 2 in the case where support 32 has raised areas.

Figure 11A:
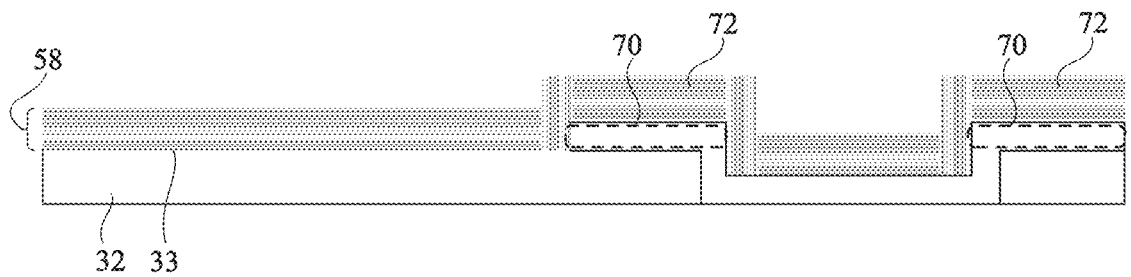
FIGS. 11A to 11D are partial simplified cross-section views of structures obtained at successive steps of a non-satisfactory method of manufacturing the optoelectronic device shown in FIGS. 1 and 2 in the presence of raised areas.

FIG. 11A shows the structure obtained after a step similar to that previously described in relation with FIG. 10A and comprising the deposition of first stack 58 on upper surface 33 of support 32. It should be noted that, in the present embodiment, support 32 comprises areas 70 raised with respect to the base plane of surface 33. As an example, raised areas 70 may have a thickness in the order of 1 µm with respect to the base plane of surface 33. Raised areas 70 are not intended to be covered with filter pixels. However, stack 58 covers raised areas 70, which results in raised areas 72 on the portions of stack 58 covering raised areas 70.

Figure 11B:
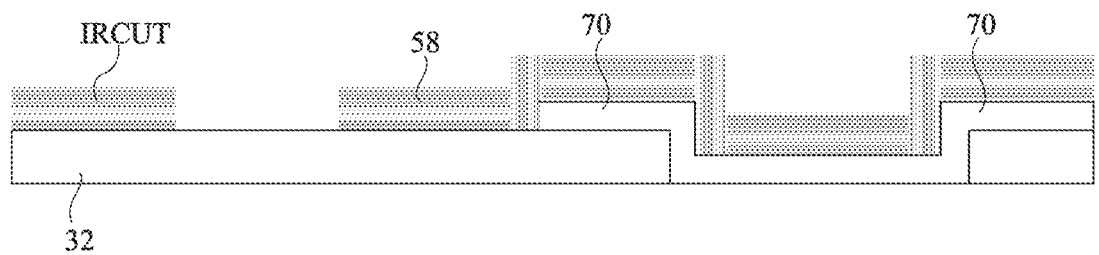

FIG. 11B shows the structure obtained after a step similar to that previously described in relation with FIG. 10B comprising the etching of stack 58, in particular to form the first interference filters IRCUT.

Figure 11C:
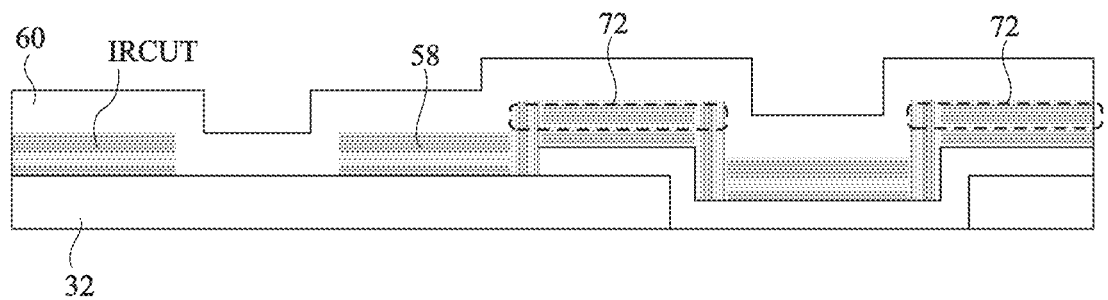

FIG. 11C shows the structure obtained after a step similar to that previously-described in relation with FIG. 10C and comprising the deposition of dielectric layer 60 all over the structure formed at the previous step and particularly on raised areas 72.

Figure 11D:
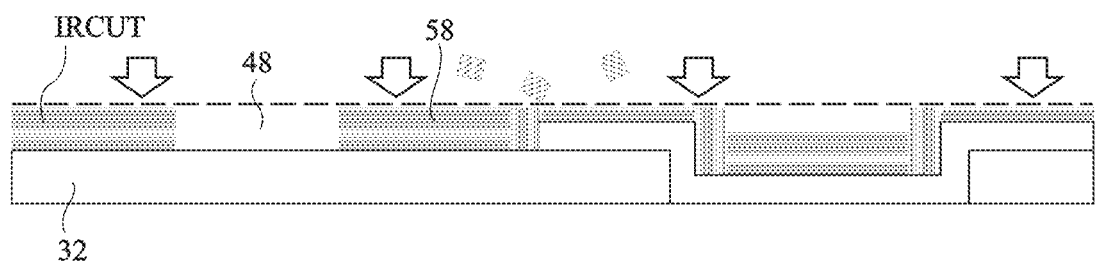

FIG. 11D shows the structure obtained after a planarization step similar to that previously described in relation with FIG. 10D. In the present embodiment, the planarization step is carried on until the top of stack 58 outside of raised areas 72 is reached. This causes the etching of raised areas 72. A disadvantage is that raised areas 72 comprise vertical or inclined lateral spacers having a multilayer structure. When the planarization, particularly by CMP, reaches the spacers, large pieces may be torn off and disperse all over the structure, making the structure unusable.

The method may then possibly not be carried on due to the defects generated in the planarization step on the spacers having inclined multilayer structures.

FIGS. 12A to 12K show the structures obtained at successive steps of a variation of the embodiment of the method described in relation with FIGS. 10A to 10H for the manufacturing of the electronic device shown in FIGS. 1 and 2, such a variation being adapted to the case where support 32 comprises raised areas having a height with respect to the base plane of support 32 smaller than the thickness of first interference filters IRCUT.

Figure 12A:
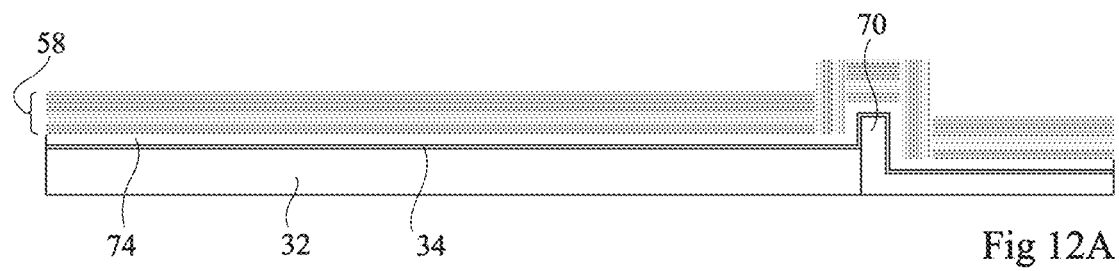
FIGS. 12A to 12K are partial simplified cross-section views of structures obtained at successive steps of another embodiment of a method of manufacturing the optoelectronic device shown in FIGS. 1 and 2 in the presence of raised areas.

FIG. 12A shows the structure obtained after a step similar to the step previously described in relation with FIG. 11A, with the difference that a dielectric layer 74 is interposed between stack 58 and support 32. Insulating layer 74 has the same thickness and the same composition as layer 40.

Figure 12B:
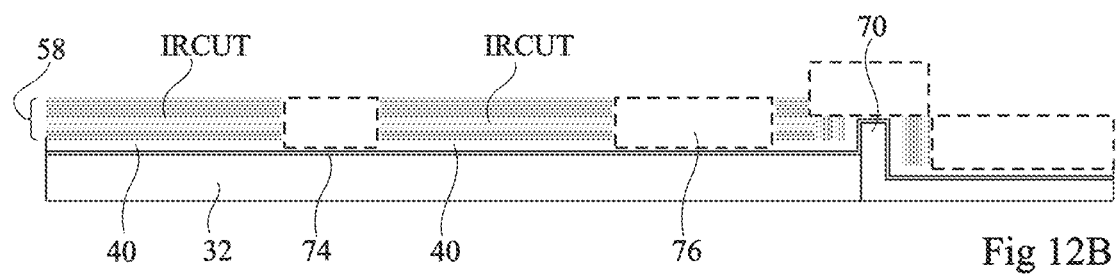

FIG. 12B shows the structure obtained after a step similar to the step previously described in relation with FIG. 11B and comprising the etching of stack 58 and of a portion of dielectric layer 74, both at the desired locations of second filter pixels $PF_{IRBP}$, and on raised areas 70. This enables to delimit interference filters IRCUT and layers 40 for each filter pixel $PF_{IRCUT}$. Dielectric layer 74 enables to perform an overetching while avoiding an unwanted etching of antireflection layer 34 on removal of stack 58. In FIG. 12B, an etching of stack 58 is further carried out in an area 76 which may be used at a subsequent step to perform metrological control operations.

Figure 12C:
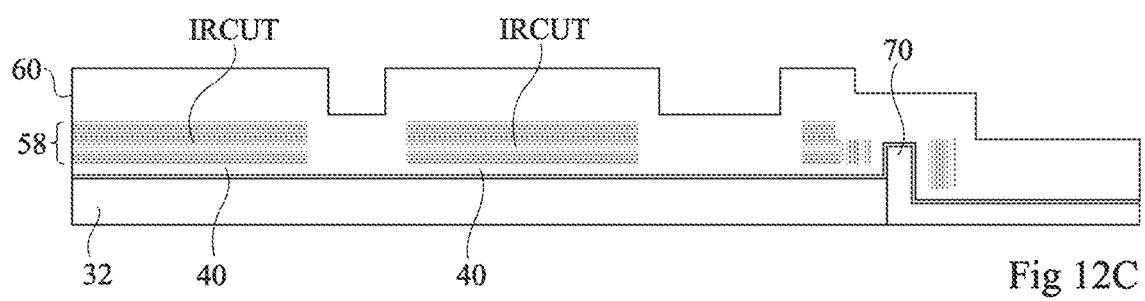

FIG. 12C shows the structure obtained after a step similar to the step previously described in relation with FIG. 10C. The thickness of dielectric layer 60 is greater than the thickness of stack 58, for example, in the order of 1.5 times the thickness of stack 58, for example, in the order of 3 µm.

Figure 12D:
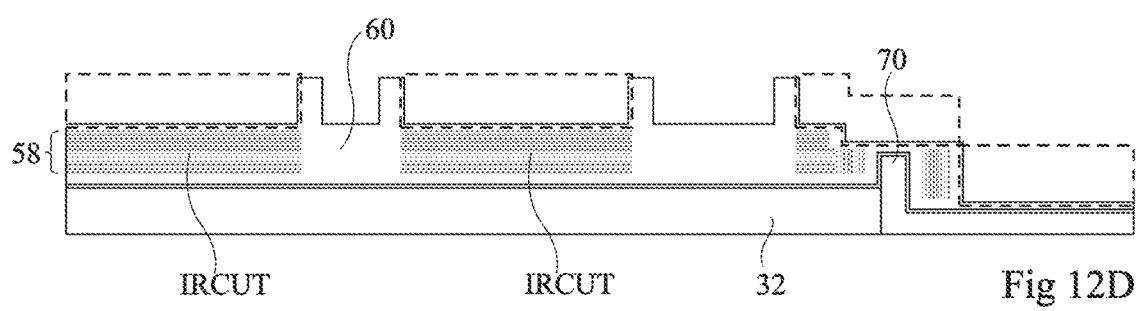

FIG. 12D shows the structure obtained after a step of at least partially etching the portions of layer 60 covering interference filters IRCUT and covering raised areas 70. This step may comprise a photolithography step using the mask complementary to the mask used for the etching of stack 58 at the step previously described in relation with FIG. 12B. Such a step of etching layer 60 may be omitted.

Figure 12E:
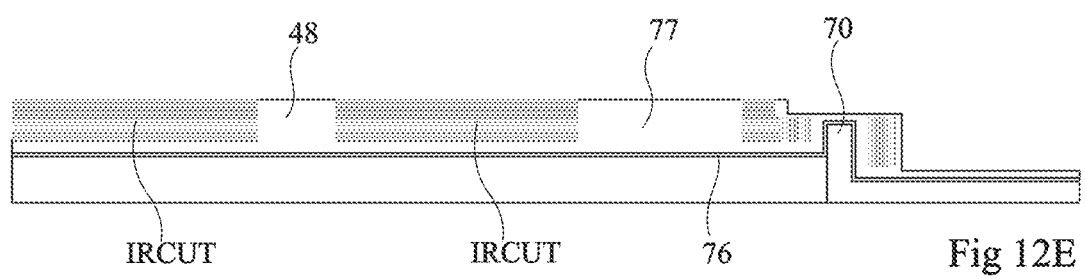

FIG. 12E shows the structure obtained after a step of planarization, for example, by CMP, similar to the step previously described in relation with FIG. 10D. Preferably, the last deposited layer of stack 58 corresponds to a stop layer for the planarization step. When the step previously described in relation with FIG. 12D is present, it enables to ease the CMP planarization step. The planarization step particularly enables to delimit dielectric blocks 48 and insulating block 77 at location 76. This step particularly enables to properly control the thickness of block 48, which is, by this method, substantially equal to that of interference filter IRCUT at this stage of the method. The control of the thickness of block 48 is important for a good quality of the spectral response of filter pixel $PF_{IRBP}$.

It may be advantageous for the stopping of the step of planarization of layer 60 to be carried out on a stop layer rather than after a determined time period. Indeed, it may be difficult, with a stopping of the planarization step at the end of a determined time period, to control the remaining thickness of dielectric layer 60 with as much accuracy as in a stopping of the planarization step on a stop layer. Further, this means that the stopping of the planarization may be non-uniform over the surface of the structure. There may in particular be a dispersion of the thicknesses of the remaining portion of dielectric layer 60 which is too large with regard to the sizing constraints for a proper operation of the filter pixels. It may further be difficult to exactly repeat the same stopping conditions from one optoelectronic device to the other.

Figure 12F:
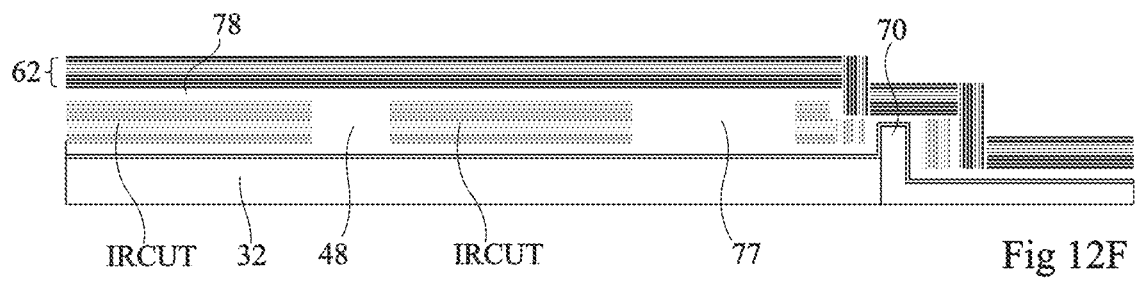

FIG. 12F shows the structure obtained after a step similar to the step previously described in relation with FIG. 10E, with the difference that the step of depositing stack 62 is preceded by a step of depositing a dielectric layer 78 all over the structure obtained at the previous step, made of the same material as layer 60 or having a close refraction index. The thickness of layer 78 is well controlled since it results from a deposition. Thereby, in the present embodiment, the thickness of dielectric layer 48 is greater than the thickness of interference filter IRCUT and is selected to optimize the transmission of the second interference filter IRBP deposited on block 48.

Figure 12G:
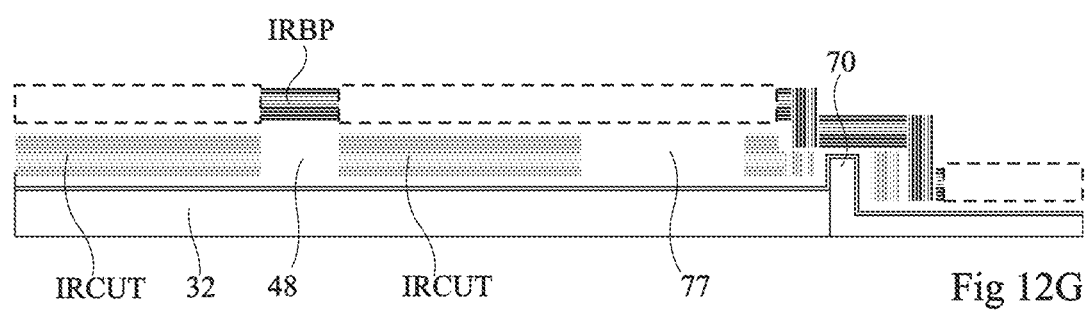

FIG. 12G shows the structure obtained after a step similar to the step previously described in relation with FIG. 10F comprising etching the portions of stack 62 and all or part of the dielectric layer 78 covering interference filters IRCUT and, further, covering raised areas 72 and dielectric block 77. Preferably, the last deposited layer of stack 58 corresponds to an etch stop layer for the etch step of dielectric layer 78. This step causes the delimitation of interference filters IRBP.

Figure 12H:
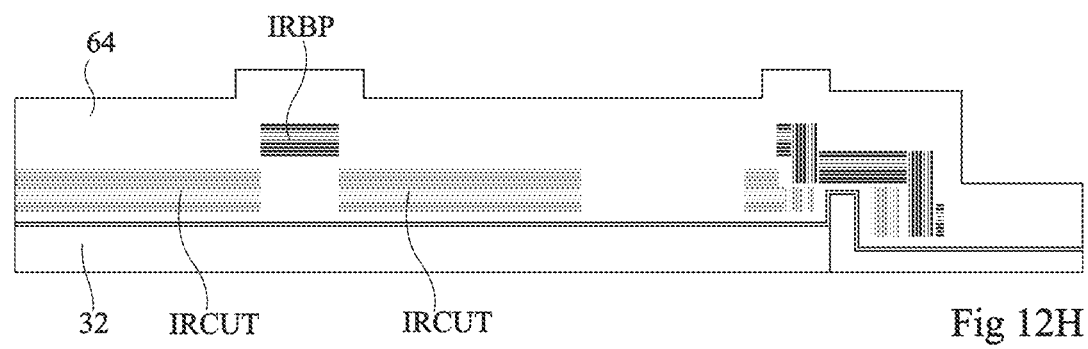

FIG. 12H shows the structure obtained after a step similar to the step previously described in relation with FIG. 10G. The thickness of layer 64 may be in the order of from 1.5 μm to 2.5 μm. This thickness is not critical for the performance of optoelectronic device 30, provided for the index difference with the materials of the subsequently-deposited color filters and the material forming the subsequently-deposited lenses to be small, preferably smaller than 0.2.

Figure 12I:
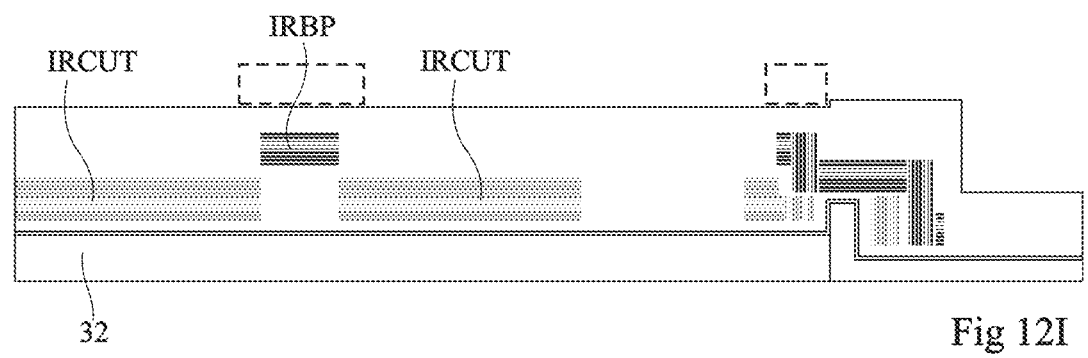

FIG. 12I shows the structure obtained after a step of at least partially etching the portions of layer 64 covering interference filters IRBP and covering raised areas 70. This step may comprise a photolithography step using the mask complementary to the mask used for the etching of stack 62 at the step previously described in relation with FIG. 12G. Such a step of etching layer 64 may be omitted.

Figure 12J:
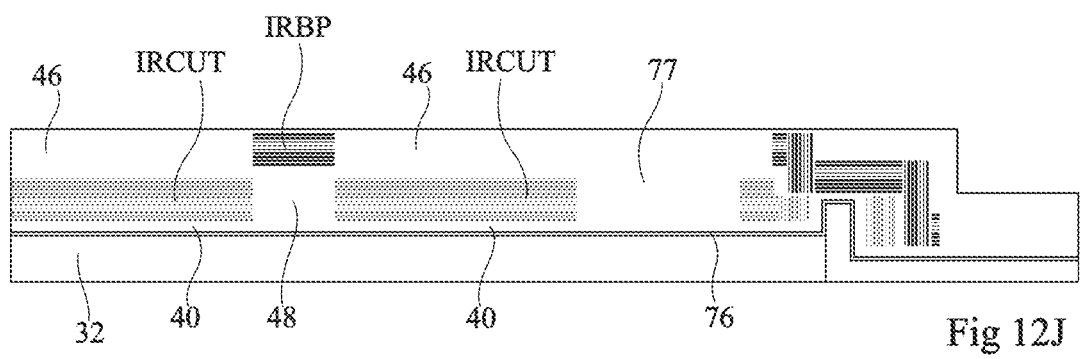

FIG. 12J shows the structure obtained after a planarization step, for example, by CMP, similar to the step previously described in relation with FIG. 10H. According to an embodiment, the stopping of the planarization step may be performed at the end of a determined time period before reaching interference filters IRBP. According to another embodiment, the last deposited layer of stack 62 corresponds to a stop layer for the planarization step. When the step previously described in relation with FIG. 12I is present, it enables to ease the CMP planarization step. The planarization step enables, in particular, to delimit dielectric blocks 46 and dielectric block 77 at location 76 and to ease the spreading of the resins on forming of color filters R, G, B, IR.

Figure 12K:
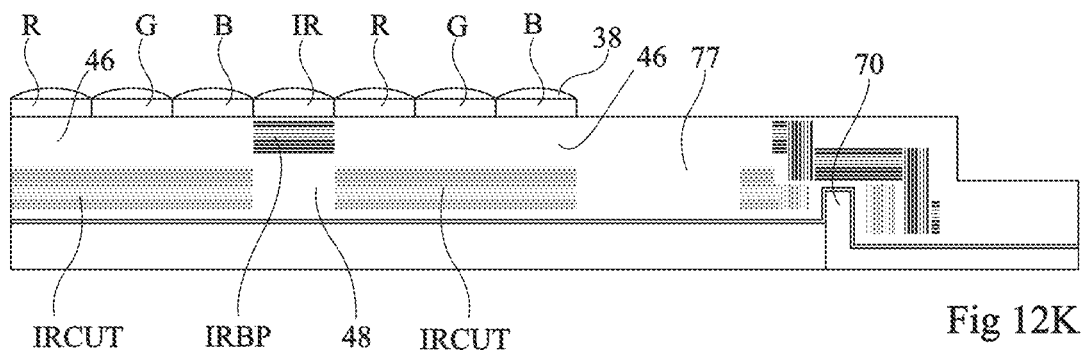

FIG. 12K shows the structure obtained after the forming of color filters R, G, B, IR and of lenses 38.

Figure 13:
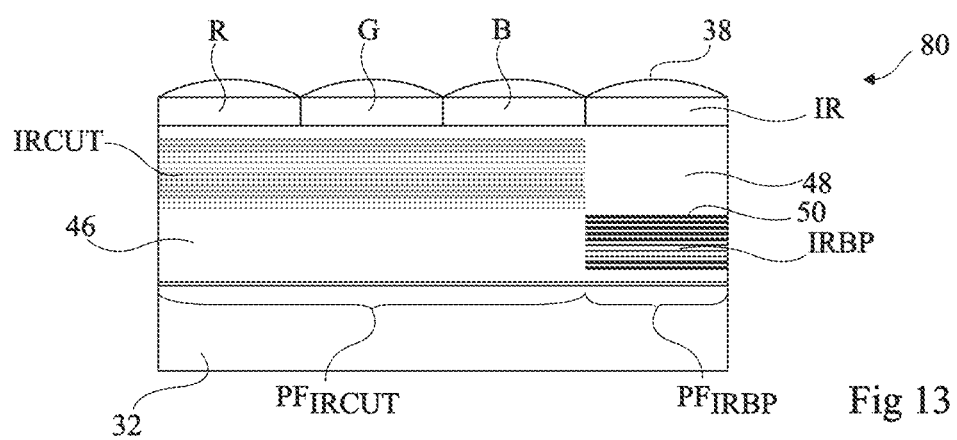
FIGS. 13 to 17 are partial simplified cross-section views of other embodiments of an optoelectronic device comprising an interference filter.

FIG. 13 is a partial simplified cross-section view of another embodiment of an optoelectronic device 80 comprising all the elements of optoelectronic device 30 shown in FIGS. 1 and 2, with the difference that the relative positions between blocks 46, 48, and interference filters IRCUT, IRBP, in the stacking direction of the layers on support 32, are inverted with respect to optoelectronic device 30. As an example, for each first filter pixel $PF_{IRCUT}$, dielectric block 46 is interposed between support 32 and interference filter IRCUT and, for each second filter pixel $PF_{IRBP}$, interference filter IRBP is interposed between support 32 and dielectric block 48. Interference filter IRCUT is thus formed on the dielectric block 46 having a thickness greater than or equal to that of interference filter IRBP while interference filter IRBP is directly formed on support 32 or on a thin dielectric layer. This may be advantageous since filter pixel $PF_{IRBP}$ may be more sensitive, in terms of optical performances, to geometric dispersions and refraction index dispersions than filter pixel $PF_{IRCUT}$. Thereby, the impact, in optoelectronic device 80, of the thickness dispersion of dielectric block 46 under interference filter IRCUT on the optical response of filter pixel $PF_{IRCUT}$ is thus lighter than the impact, in optoelectronic device 30, of the thickness dispersion of dielectric block 48 under interference filter IRBP on the optical response of filter pixel $PF_{IRBP}$. However, in the present embodiment, it may be necessary to provide a specific etch stop layer at the top of interference filter IRBP since layer 50 of the dielectric material having a high refraction index $n_{H2}$ at the top of interference filter IRBP may be unable to be used as an etch stop layer for the material of low refraction index $n_{H1}$ of interference filter IRCUT.

Figure 14:
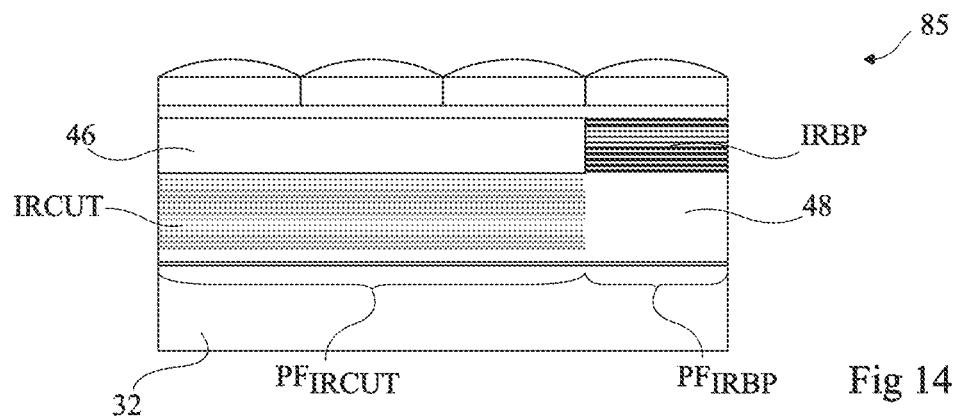

FIG. 14 is a partial simplified cross-section view of another embodiment of an optoelectronic device 85 where the dielectric block 46 for each first filter pixel $PF_{IRCUT}$ is formed of a self-planarizing resin. This advantageously enables to simplify the method of manufacturing optoelectronic device 85 with respect to optoelectronic device 30. Indeed, the steps previously described in relation with FIGS. 12H to 12J may be replaced with a single step of deposition of the self-planarizing resin. According to an embodiment, the self-planarizing resin is made of a material substantially transparent to visible light and to infrared radiation. According to another embodiment, the self-planarizing resin is made of a material substantially transparent to visible light and substantially opaque to infrared radiation.

In the previously-described embodiments, the color filter IR covering the second filter pixel $PF_{IRBP}$ is made of black resin. The color filter advantageously enables to block radiations at wavelengths smaller than approximately 800 nm and eases the design of interference filter IRBP. However, according to another embodiment, the IR filter may be replaced with a resin at least partially transparent to visible light.

In the previously-described embodiments, lenses 38 have identical structures for all color filters R, G, B, IR.

Figure 15:
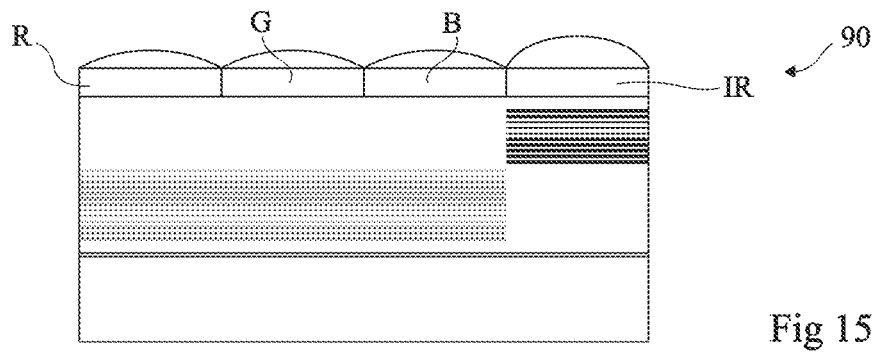

FIG. 15 is a partial simplified cross-section view of another embodiment of an optoelectronic device 90 where lenses 38 have different shapes according to color filters R, G, B, IR. As an example, FIG. 15 shows the lens associated with color filter IR as being thicker than the lenses associated with the other color filters R, G, and B. This particularly enables to adapt to photodiodes having different characteristics (for example, a greater size of pixel IR or a different filling factor of the visible photodiodes) and/or to adapt to the spectral responses of the assembly comprising the filter pixel and the lens.

The photodiodes covered with filter pixels $PF_{IRCUT}$ and $PF_{IRBP}$ may have the same dimensions or different dimensions. The first filter pixel $PF_{IRCUT}$ preferably covers as many photodiodes as there are different types of color filters R, G, and B giving way to visible light. The second filter pixel may cover a single photodiode or at least two photodiodes.

Figure 16:
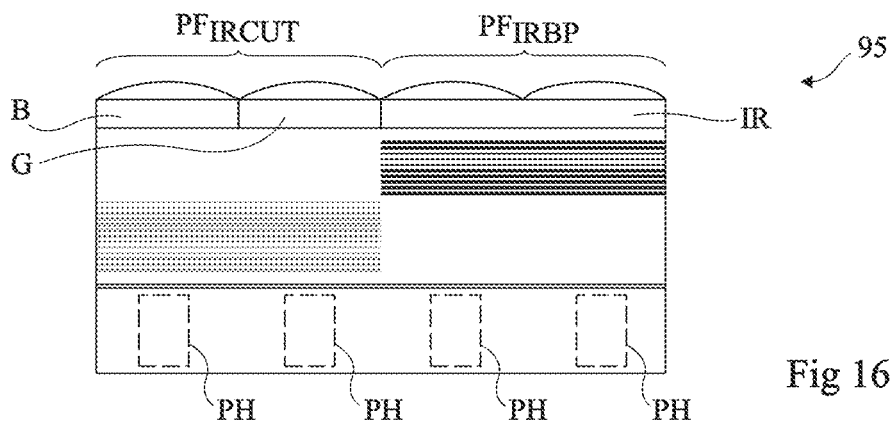
Figure 17:
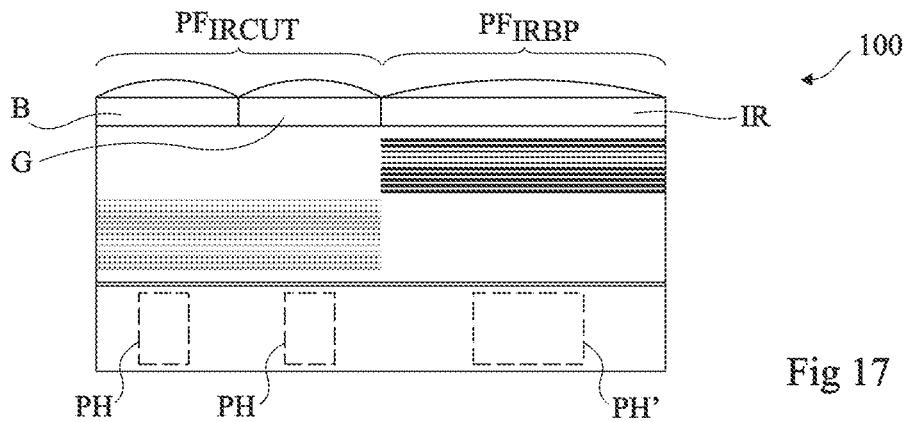
Figure 18:
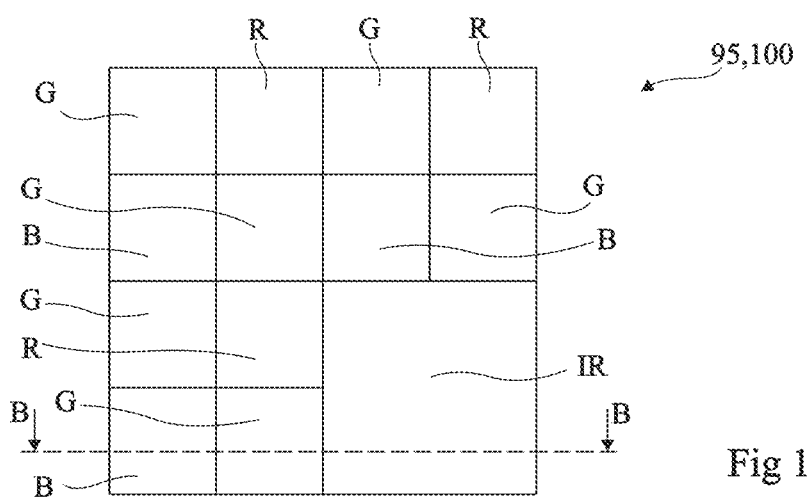
FIG. 18 is a partial simplified top view of the optoelectronic device shown in FIG. 16 or 17.

FIGS. 16 and 17 are partial simplified cross-section views of other embodiments of optoelectronic devices 95, 100. FIG. 18 is a top view of the optoelectronic device 95, 100 shown in FIG. 16 or 18. FIGS. 16 and 17 are cross-section views of FIG. 18 along line B-B. For the optoelectronic device 95 shown in FIG. 16, each second filter pixel $PF_{IRBP}$ covers two photodiodes PH. For the optoelectronic device 100 shown in FIG. 17, each second filter pixel $PF_{IRBP}$ covers a photodiode PH' of larger dimensions than the photodiodes PH associated with the first filter pixels $PF_{IRCUT}$.

Figure 19:
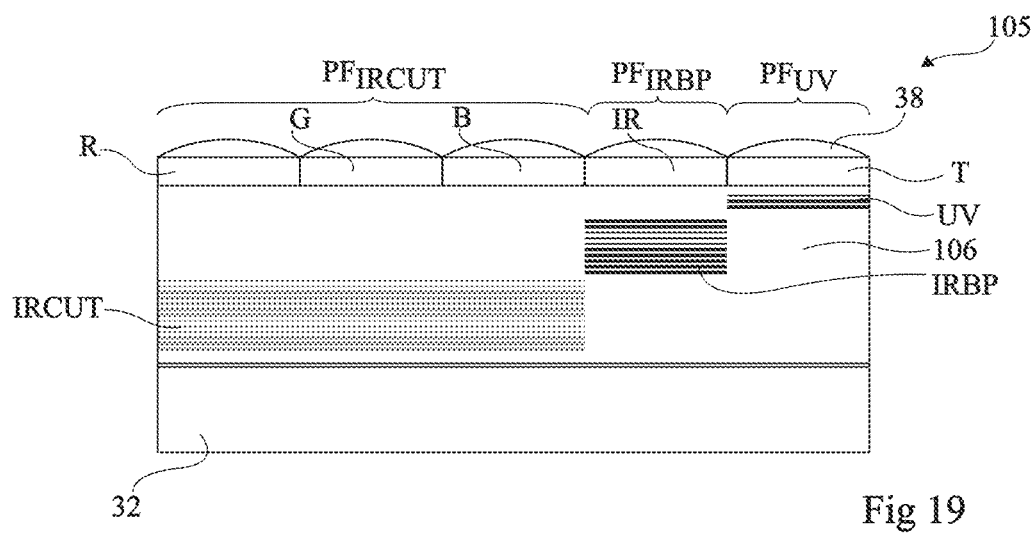
FIGS. 19 to 21 are partial simplified cross-section views of other embodiments of an optoelectronic device comprising an interference filter.

FIG. 19 is a cross-section view of another embodiment of an optoelectronic device 105 where optoelectronic device 105 comprises all the elements of the optoelectronic device 30 shown in FIGS. 1 and 2 and further comprises a third filter pixel $PF_{UV}$, for example, capable of filtering ultraviolet radiation, covered with a filter T and with a lens 38. In this case, the third filter pixel may comprise, on support 32, an insulating block 106 made of a dielectric material and an interference filter UV, for example comprising an alternation of metal layers and of dielectric layers, for example, an alternation of silver or aluminum layers and of dielectric layers. The color filter T covering the third filter pixel $PF_{UV}$ may be made of transparent resin.

Figure 20:
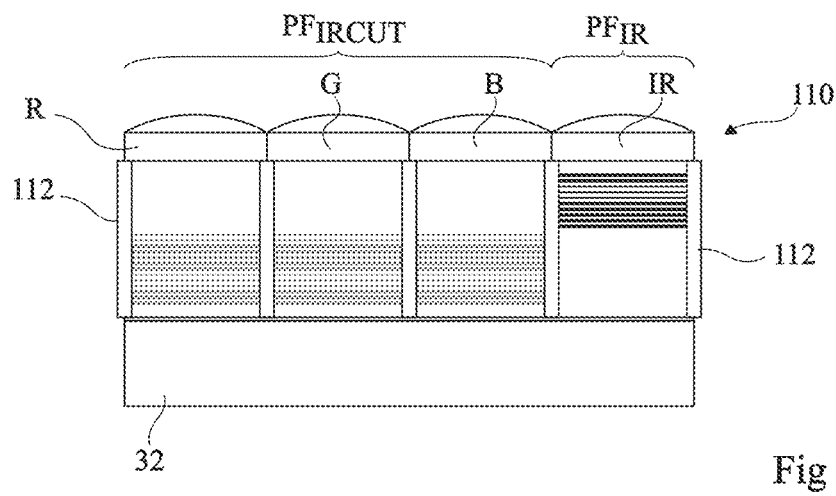

FIG. 20 is a cross-section view of another embodiment of an optoelectronic device 110 where optoelectronic device 110 comprises all the elements of the optoelectronic device 30 shown in FIGS. 1 and 2 and further comprise reflective walls 112 which extend across the entire thickness of filter pixels $PF_{IRCUT}$ and $PF_{IRBP}$ and which separate the second filter pixels $PF_{IRBP}$ from the first filter pixels $PF_{IRCUT}$ and which, further, for each first filter pixel $PF_{IRCUT}$, delimit a portion of the first filter pixel $PF_{IRCUT}$ opposite each color filter R, G, B. Walls 112 reflect visible light and infrared radiation, particularly near infrared radiation. Walls 112 may be metallic or comprise a metal coating having a thickness typically greater than 50 nm. This advantageously enables to decrease the optical crosstalk of optoelectronic device 110. Walls 112 may be formed after the step of forming filter pixels $PF_{IRCUT}$ and $PF_{IRBP}$.

Figure 21:
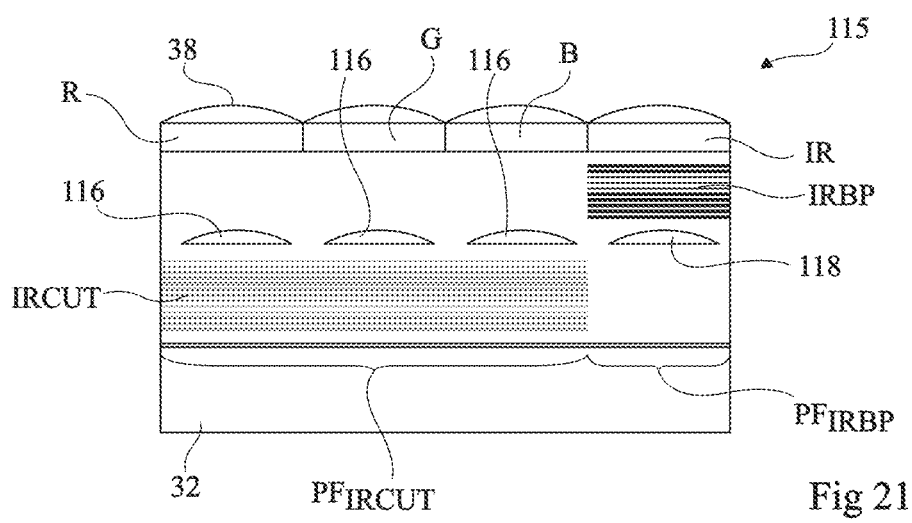

FIG. 21 is a cross-section view of another embodiment of an optoelectronic device 115 where optoelectronic device 115 comprises all the elements of the optoelectronic device 30 shown in FIGS. 1 and 2 and further comprises, for each first filter pixel $PF_{IRCUT}$, lenses 116 covering the interference filter IRCUT of first filter pixel $PF_{IRCUT}$, each lens 116 being interposed between interference filter IRCUT and one of color filters R, G, and B. Optoelectronic device 115 further comprises, for each first filter pixel $PF_{IRBP}$, a lens 118 covered with the interference filter IRBP of second filter pixel $PF_{IRBP}$, each lens 118 being interposed between interference filter IRBP and support 32. This enables to decrease the optical crosstalk of optoelectronic device 115. Lenses 116, 118 are for example made of silicon nitride to provide a sufficient refraction index contrast with the neighboring medium, for example, an oxide, preferably an interval greater than 0.5. A step of planarizing the oxide layer deposited above silicon nitride lenses 116, 118 is preferably carried out before the forming of interference filter IRBP.

Specific embodiments have been described. Various alterations, modifications, and improvements will readily occur to those skilled in the art. In particular, although, in the previously-described embodiments, each lens 38 is shown as being centered with respect to the associated photodiode PH, it should be clear that for certain applications, each lens may be off-centered with respect to the associated photodiode. Further, in the previously-described embodiments, the manufacturing methods may be modified to ascertain that the interference filters IRCUT of the first filter pixels $PF_{IRCUT}$ vary according to the position of pixel filter $PF_{IRCUT}$ in the optoelectronic device.

Various embodiments with different variations have been described hereabove. It should be noted that those skilled in the art may combine these various embodiments and variations without showing any inventive step. In particular, at least two of the embodiments of optoelectronic devices 80, 85, 90, 95, 100, 105, 110, 115 may be combined together.

The invention claimed is:

1. A pixelated interference filter intended to rest on a support and comprising, in a stacking direction:
   first filter pixels each comprising a first interference filter covered with a first dielectric block; and
   second filter pixels each comprising a second dielectric block, having a thickness greater than or equal to the thickness of the first interference filter, covered with a second interference filter, having a thickness smaller than or equal to the thickness of the first dielectric block,
   wherein, for at least one of the second filter pixels, the second dielectric block of the second filter pixel is interposed between the first interference filters of two first filter pixels and the second interference filter of the second filter pixel is interposed between the first dielectric blocks of the first two filter pixels,
   the pixelated interference filter comprising, between each pair of first and second adjacent filter pixels, a transition area having a minimum dimension between the first filter pixel and the second filter pixel of said pair, perpendicularly to the stacking direction, smaller than 500 nm,
   and wherein the pixelated interference filter comprises first and second opposite surfaces, the first surface being in contact with the support and the second surface being substantially planar.

2. The pixelated interference filter of claim 1, wherein each first interference filter comprises an alternation of first dielectric layers of a first dielectric material having a first refraction index in the visible range and of second dielectric layers of a second dielectric material having a second refraction index in the visible range smaller than the first refraction index and wherein each second interference filter comprises an alternation of third dielectric layers of a third dielectric material having a third refraction index in the infrared range and of fourth dielectric layers of a fourth dielectric material having a fourth refraction index in the infrared range smaller than the third refraction index; or
   wherein each first interference filter comprises an alternation of the third dielectric layers and of the fourth dielectric layers and wherein each second interference filter comprises an alternation of the first dielectric layers and of the fourth dielectric layers.

3. The pixelated interference filter of claim 2, wherein the first dielectric material may be selected from the group comprising silicon nitride, hafnium oxide, aluminum oxide, an alloy of aluminum, oxygen, and nitrogen, an alloy of silicon, oxygen, carbon, and nitrogen, silicon nitride, niobium oxide, tantalum oxide, titanium oxide, and mixtures of at least two of these compounds.

4. The pixelated interference filter of claim 2, wherein the second dielectric material and/or the fourth dielectric material may each be selected from the group comprising silicon dioxide, magnesium fluoride, silicon oxide, silicon oxynitride, hafnium oxide, aluminum oxide, a film made up of aluminum, oxygen, and nitrogen, a film made up of silicon, oxygen, carbon, and nitrogen, silicon nitride, and mixtures of at least two of these compounds.

5. The pixelated interference filter of claim 2, wherein the third dielectric material may be selected from the group comprising amorphous silicon, hydrogenated amorphous silicon, and mixtures of these compounds.

6. An image sensor comprising a support and the pixelated interference filter of claim 1 resting on the support.

7. The image sensor of claim 6, further comprising an antireflection layer between the support and the pixelated interference filter.

8. The image sensor of claim 6, comprising, for each first filter and covering said first filter pixel, at least one color filter capable of giving way to visible light only in a first wavelength range and one color filter capable of giving way to visible light only in a second wavelength range different from the first range.

9. The image sensor of claim 8, comprising, for each color filter of each first filter pixel, a first lens covering said color filter and comprising, for each second filter pixel, a second lens covering the second filter pixel.

10. A method of manufacturing the pixelated interference filter of claim 1, comprising the successive steps of:
   a) depositing, on a substrate, a first stack of dielectric layers having the structure of the first interference filters;
   b) etching the first stack to remove the first stack from the locations of the second filter pixels and keep the first interference filters at the locations of the first filter pixels;
   c) depositing a first insulating layer having a thickness greater than the thickness of the first stack, on the first interference filters and between the first interference filters;
   d) etching at least a portion of the first insulating layer on the first interference filters;
   e) depositing a second stack of dielectric layers having the structure of the second interference filters;
   f) etching the second stack to remove the second stack from the locations of the first filter pixels and keep the second interference filters at the locations of the second filter pixels;
   g) depositing a second insulating layer, having a thickness greater than the thickness of the second stack, on the second interference filters and between the second interference filters; and
   h) etching at least a portion of the second insulating layer on the second interference filters.

11. The method of claim 10, wherein, at step a), the first stack is deposited on a support comprising at least one raised area, the method comprising, at step b), etching the portion of the first stack covering the raised area.

12. The method of claim 10, wherein the etching of the first insulating layer and/or of the second insulating layer comprises a chemical-mechanical polishing step.

* * * * *

UNITED STATES PATENT AND TRADEMARK OFFICE
CERTIFICATE OF CORRECTION

| | |
|---|---|
| PATENT NO. | : 11,442,206 B2 |
| APPLICATION NO. | : 16/434104 |
| DATED | : September 13, 2022 |
| INVENTOR(S) | : Laurent Frey et al. |

It is certified that error appears in the above-identified patent and that said Letters Patent is hereby corrected as shown below:

In the Claims

At Column 15, Claim 8 and Line 28, add the word "pixel" after filter.

Signed and Sealed this
Fifteenth Day of November, 2022

Katherine Kelly Vidal
*Director of the United States Patent and Trademark Office*